United States Patent [19]

Brozovich et al.

[11] Patent Number: 5,661,434
[45] Date of Patent: Aug. 26, 1997

[54] HIGH EFFICIENCY MULTIPLE POWER LEVEL AMPLIFIER CIRCUIT

[75] Inventors: R. Steven Brozovich, San Jose; Wayne Kennan, Palo Alto, both of Calif.

[73] Assignee: Fujitsu Compound Semiconductor, Inc., San Jose, Calif.

[21] Appl. No.: 439,820

[22] Filed: May 12, 1995

[51] Int. Cl.[6] ........................................ H03F 1/14
[52] U.S. Cl. ........................................ 330/51; 330/310
[58] Field of Search ................................ 330/51, 129, 150, 330/278, 302, 310, 311, 124 D

[56] References Cited

U.S. PATENT DOCUMENTS

| | | | |
|---|---|---|---|
| 3,444,550 | 5/1969 | Paulus | 330/150 |
| 4,439,744 | 3/1984 | Kumar et al. | 330/285 |
| 4,546,324 | 10/1985 | Bingham et al. | 330/51 X |
| 4,565,972 | 1/1986 | Kaegebein | 330/124 D |
| 4,667,167 | 5/1987 | Kupfer | 330/281 |
| 4,876,742 | 10/1989 | Vacon et al. | 455/66 |
| 4,994,757 | 2/1991 | Bickley et al. | 330/285 |
| 5,048,117 | 9/1991 | Aisaka et al. | 455/89 |
| 5,115,245 | 5/1992 | Wen et al. | 342/175 |
| 5,152,004 | 9/1992 | Väisänen et al. | 455/68 |
| 5,220,564 | 6/1993 | Tuch et al. | 370/94.1 |
| 5,239,685 | 8/1993 | Moe et al. | 455/73 |
| 5,276,912 | 1/1994 | Siwiak et al. | 455/73 |
| 5,282,222 | 1/1994 | Fattouche et al. | 375/1 |
| 5,315,303 | 5/1994 | Tsou et al. | 342/27 |
| 5,349,306 | 9/1994 | Apel | 330/277 |
| 5,363,055 | 11/1994 | Ribner | 330/51 X |
| 5,369,639 | 11/1994 | Kamerman et al. | 370/85.3 |
| 5,381,115 | 1/1995 | Timmons et al. | 330/279 |
| 5,389,896 | 2/1995 | Kobayashi | 330/282 |

*Primary Examiner*—Steven J. Mottola
*Attorney, Agent, or Firm*—Christie, Parker & Hale LLP

[57] ABSTRACT

A high efficiency multiple power level amplifier circuit for reducing power consumption during low power operations. A plurality of power amplifier stages are cascaded to provide multiple levels of amplification. At least one power amplification stage includes a signal switching network to allow one or any combination of power amplifiers to be switched out when lower power operations are desired. The switched out power amplifiers are biased such that substantially no current is drawn from the power source.

20 Claims, 4 Drawing Sheets

HIGH EFFICIENCY MULTIPLE POWER LEVEL AMPLIFIER CIRCUIT

FIELD OF THE INVENTION

The present invention relates to high frequency power amplifiers and more specifically to a high efficiency multiple power level amplifier circuit for minimizing power consumption.

BACKGROUND OF THE INVENTION

Solid state amplifiers are widely used for radio-wave, microwave and milli-meter wave communications. These amplifiers are well suited for medium power applications up to a couple of hundred of watts due to their low noise, low power requirements, and dense packaging. The development of Gallium Arsenide (GaAs) Metal Semiconductor Field Effect Transistor's (MESFET) has made solid state devices more attractive for high frequency amplifier design. These amplifiers are capable of low noise, high gain and high power operation. They operate from a low voltage power source, have relatively high power added efficiency (PAE), and are highly reliable. These amplifiers may be incorporated into GaAs monolithic microwave integrated circuits (MMIC) for wireless communications. Several manufacturers have developed and marketed high performance GaAs MMIC transceiver chips for wireless local area network (WLAN) applications in the 2.4 GHz. to the 2.5 GHz range. The Raytheon RMTC2410-10 and the Celeritek CCS2900 are examples of such devices. In these applications it is desirable to design the high frequency transmit power amplifier to operate at multiple power levels to minimize interference with other transceiver devices.

Various techniques have been employed to provide multiple power level capability for wireless communications. One way is to place an attenuator between two power amplifier stages to reduce the output signal level. This design results in low efficiency, and hence undesirable power consumption, because the power amplifier stages still draw bias current.

Variable Gain Amplifiers (VGA) have also been employed in this area to produce multiple power level outputs. Typically, a parallel arrangement of Field Effect Transistors (FET) may be disposed between a power divider and power combiner network. By selectively supplying a gate bias to each amplifier, DC power consumption may be reduced when operating in lower power modes. An example of this approach is described in U.S. Pat. No. 4,439,744. However, this design results in poor impedance matching due to the changing source impedance as the FET's are switched in and out. Consequently, this design suffers from low efficiency, reduced gain and undesirable power consumption.

Accordingly, there is a need for a multiple power level amplifier that maintains high efficiency for all power output levels. A higher efficiency will result in reduced DC power consumption when transmitting at lower power which will result in prolonged battery life in desktop, laptop and handheld computer environments.

SUMMARY OF THE INVENTION

The present invention is directed to a high efficiency multiple power level amplifier circuit that is capable of satisfying the need in the existing art. The high efficiency multiple power level amplifier circuit has a plurality of power amplifier stages connected in a cascade network. At least one power amplifier stage includes a power amplifier having an enable mode for amplifying signals received at its input and a bypass mode wherein substantially no current is drawn from an external power source. A signal switching network is included for bypassing the power amplifier and isolating the power amplifier from the signal path in the bypass mode. Each power amplifier is substantially matched to the system characteristic impedance at its input and output. The system characteristic impedance is defined by the impedance of an external load.

With this arrangement the PAE can be maintained at all signal output power levels by operating each power amplifier stage at peak efficiency when they are being used. When a power amplifier is bypassed it draws essentially no current reducing power consumption. Also, excellent impedance matching can be maintained regardless of the power output level.

These features result in significant DC power savings in the lower power modes and therefore the present invention is ideal for battery operated systems such as portable desktop, laptop, and hand-held computers. These and other features, aspects, and advantages of the present invention will become better understood with regard to the following description, appended claims, and accompanying drawings where:

DETAILED DESCRIPTION

Figure 1:
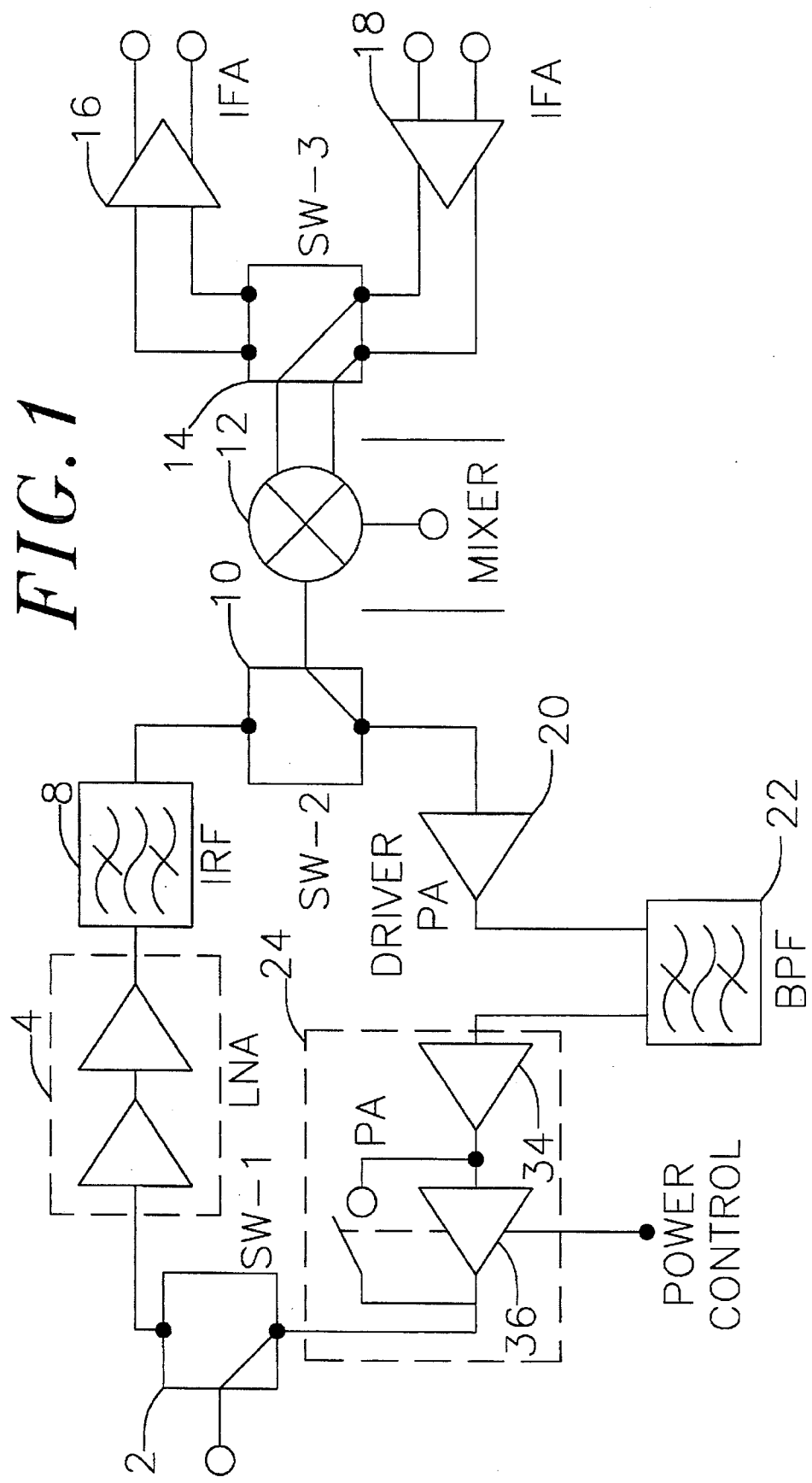
FIG. 1 is a schematic and block diagram of a GaAs MMIC transceiver incorporating the present invention.

FIG. 1 depicts a typical application of the high efficiency multiple power level amplifier circuit in a Gallium Arsenide monolithic microwave integrated circuit (GaAs MMIC) for use in a wireless local area network (WLAN) transceiver. The WLAN transceiver comprises a receive channel and a transmit channel (to be described) where the antenna (not shown) is connected to the appropriate channel by three Transmit/Receive (T/R) switches 2, 10, 14 depending on whether the transceiver is in the transmit or the receive mode. The transmit and receive modes are controlled by off chip circuitry (not shown).

The receive channel comprises a two stage Low Noise Amplifier (LNA) 4, an Image Rejection Filter (IRF) 8 connected to the output of the LNA, a RF mixer 12 connected to the output of the IRF through the T/R switch 10 and an IF amplifier 16 connected to the output of the RF mixer through T/R switch 14. In the receive mode, T/R switch 2 is positioned such that an RF signal at the antenna is directed to the two stage LNA. The LNA provides initial amplification with good noise figure performance. The output of the LNA is directed to the IRF where image noise is rejected. The RF signal is routed through T/R switch 10 to the RF mixer 12 where it is down converted by the RF mixer 12 to an intermediate frequency (IF). T/R switch 14 is positioned such that the IF signal is directed to the IF amplifier 16.

The transmit channel comprises an IF amplifier 18, the RF mixer 12 connected to the output of the IF amplifier 18 through the T/R switch 14, a power amplifier driver 20 connected to the output of the RF mixer 12, a bandpass filter (BPF) 22 connected to the output of the power amplifier driver, and a high efficiency multiple power level amplifier circuit 24 according to the present invention connected to the output of the BPF. Power amplifier circuit 24 includes power amplifier stages 34 and 36, amplifier stage 36 being powered down and bypassed when lower power output and lower power consumption is desired. In the transmit mode, the IF signal from the IF amplifier 18 is up converted to RF by the RF mixer 12. The RF mixer output is filtered by the BPF and routed to the high efficiency multiple power level amplifier circuit 24 of the present invention.

Figure 2A:
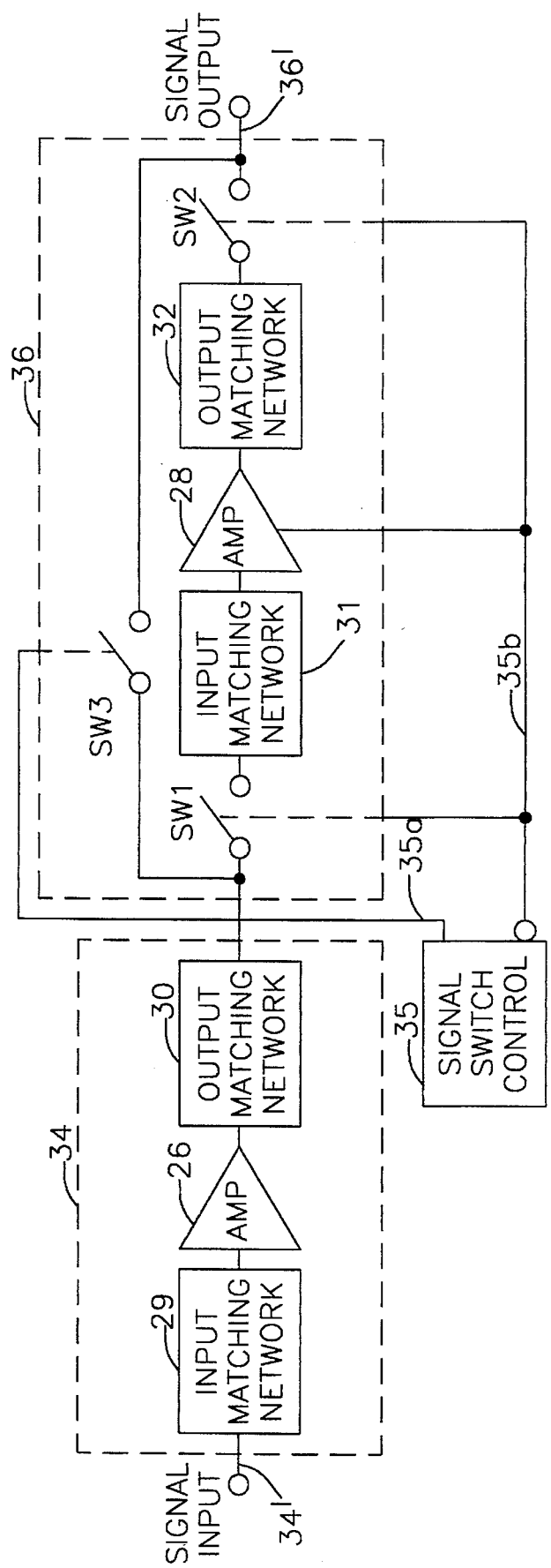
FIG. 2A is a schematic and block diagram of a dual stage power amplifier for use in the transceiver of FIG. 1.

Referring to FIG. 2a, two stage power amplifier circuit 24 is shown in more detail. The first stage amplifier 34 includes power amplifier 26 with input and output impedance matching networks. Impedance matching network 29 matches the source impedance of BPF 22 (FIG. 1) to the input of the power amplifier 26. Impedance matching network 30 matches the output impedance of the power amplifier 26 to the system characteristic impedance which is defined by the load impedance at 36'. Accordingly, when the second stage amplifier 36 is switched out as described in detail below, a match between the output of the power amplifier 26 and the load is achieved. Consequently, the input impedance matching network 31 of second stage amplifier must also be designed to match the system characteristic impedance so that first stage amplifier 34 will be matched to the second stage amplifier 36 when the signal path is directed to the second stage amplifier. The second stage amplifier 36 further includes a power amplifier 28 which amplifies the matched signal at the output of the input impedance matching network 31. An output impedance matching network 32 is provided at the output of the power amplifier 28 to match the output of the power amplifier 28 to the load impedance connected to the signal output 36'. The power amplifiers of the first and second stages may be selected from many commercially available power amplifiers known in the art. GaAs MESFET's are particularly well suited for this application due to their low noise, high gain, high PAE, high reliability and low cost.

A signal switching network is added to the second stage to bypass and power down the power amplifier in the low power mode. The signal switching network is controlled by a signal switch control 35, and includes an input isolation switch SW1, an output isolation switch SW2, and a bypass switch SW3. The switches may be GaAs MESFET's or other commercially available switches known in the art. The input isolation switch SW1 is connected in series to the input of the power amplifier 28, the output isolation switch SW2 is connected in series to the output of the power amplifier 28, and the bypass switch SW3 is connected in parallel across the input isolation switch, the output isolation switch and the power amplifier 28.

In the low power mode, the signal switch control 35 causes the bypass switch SW3 to connect the output of the first stage power amplifier 26 to the signal output 36' directed toward the load. Isolation switches SW1 and SW2 are opened to remove the second stage amplifier from the signal output path and thereby maintain the excellent impedance match. The signal switching control also causes the second stage power amplifier to be turned off so that it draws no current and consumes no power. Where a GaAs MESFET is used as the power amplifier device for the second stage, the application and removal of DC power may be controlled by a gate biasing circuit.

Under the low power mode just described, only power amplifier stage 34 amplifies the signal from the input 34' and supplies the output to the signal output 36'. The result of bypassing the second stage amplifier is that the power delivered to the signal output 36', is reduced by an amount equal to the gain of the second stage and the DC power consumption is reduced by the amount typically consumed by that stage. This allows for a low power output with reduced DC power consumption which is particularly important for desktop, laptop and hand-held computer operations.

In the high power mode, isolation switches SW1 and SW2 are closed and bypass switch SW3 is open causing the amplified output of the first stage power amplifier to be directed to the input of the second stage power amplifier. Simultaneously, the signal switch control causes DC power to be applied to the second stage power amplifier via control line 28a providing dual levels of power amplification.

Figure 2B:
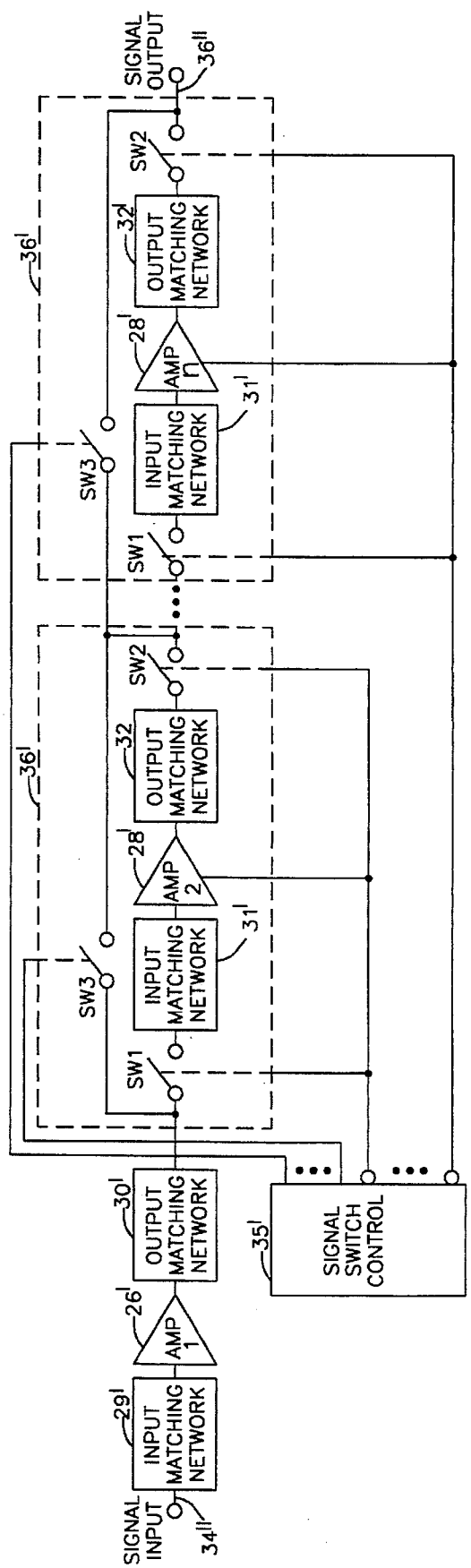
FIG. 2B is a schematic and block diagram of an embodiment of the present invention employing more than two power amplifier stages.

The present invention can be easily expanded to multiple power levels of three or more by cascading the two or more multiple power amplifier stages 36 identical to the second stage power amplifier described above with its associated signal switching network as shown in FIG. 2B. The same reference designators are used in FIG. 2B as in FIG. 2A for the same elements except that a prime is added to each reference designator in FIG. 2B.

Figure 3:
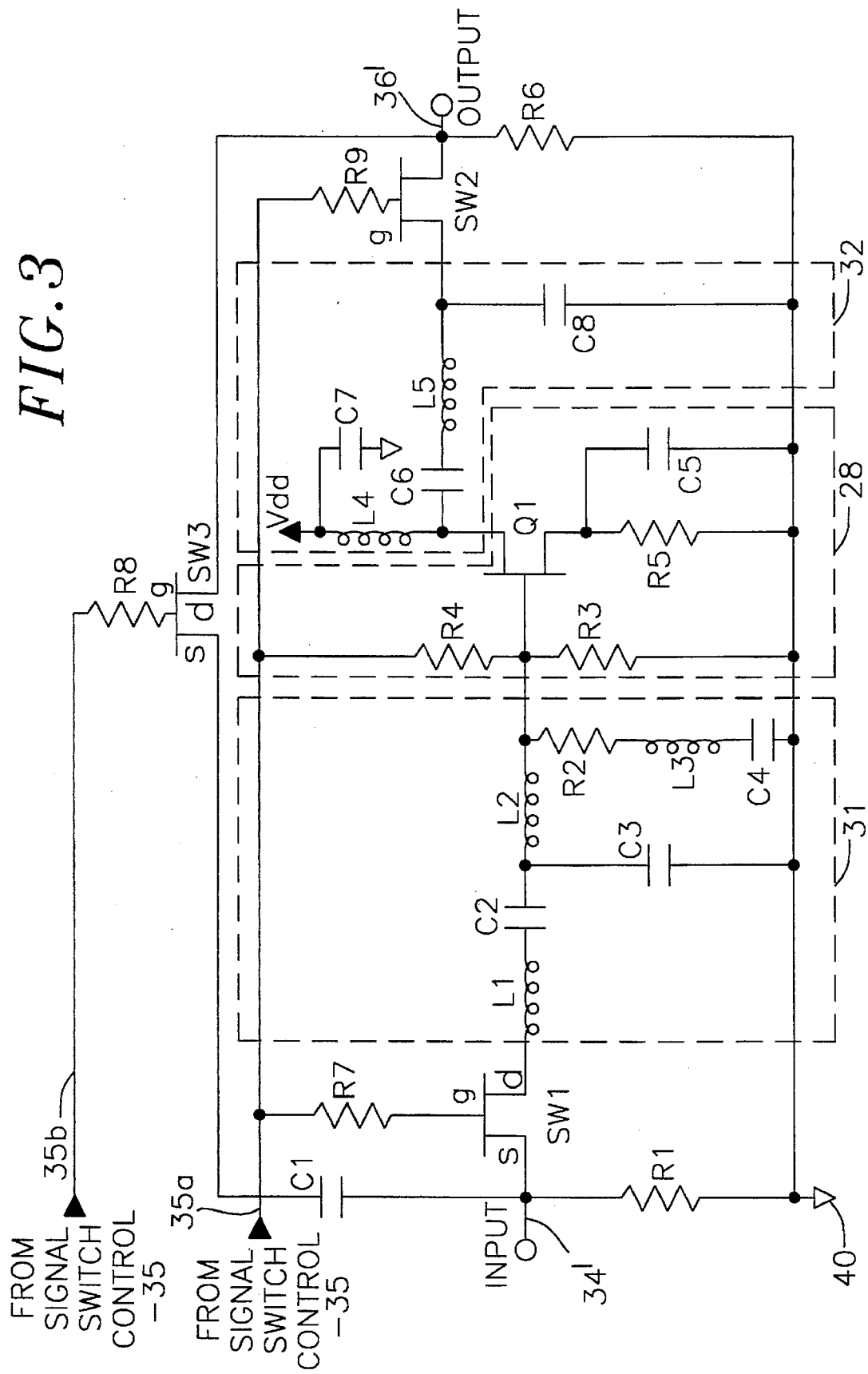
FIG. 3 is a detailed schematic diagram of a power amplifier stage with DC power down and bypass capability for use in the circuits of FIGS. 1 and 2A.

FIG. 3 depicts a detailed schematic of an embodiment of a power amplifier stage of the present invention. In this configuration, a high frequency input signal is split into two paths consisting of a first path directed to the source of MESFET switch SW1 and a second path directed to the drain of MESFET switch SW3 through blocking capacitor C1. In the bypass mode, a –5 V control signal is applied on line 35a from signal switch control 35 to the gate inputs g of MESFET switches SW1 and SW2. The gates become reverse biased with respect to their sources s through series resistors R1 and R6 in their source circuits and resistors R7 and R9 in their gate circuits respectively. Resistors R7 and R9 provide current limiting protection to the gate input g of the MESFET switches. Resistors R1 and R6 provide a reference to ground 40 for the sources s. Resistors R1 and R6 are high impedance resistors to avoid loading down the high frequency inputs and outputs. The negative gate to source voltage forces the MESFET switches SW1 and SW2 into the pinch off region. As a result, MESFET Q1 of power amplifier 26 becomes isolated from the signal input and signal output of the amplifier stage. The –5 V control signal is also applied to the gate g of MESFET Q1 causing a reverse bias of the gate with respect to the source through series resistors R4 and R5 and similarly forces the MESFET Q1 into the pinch off region. With the MESFET Q1 in the pinch off region no DC current is drawn. MESFET switch SW3 is enabled by applying to its gate g a 0 V control signal on line 35b from switch control 35 thus providing a low impedance path for the high frequency signal from the input 34' to the output 36' of the power amplifier stage.

When an increase in power output level is desired, in the circuits of FIG. 1 and 2A, the amplifier stage is taken out of the bypass mode by forcing MESFET switch SW3 into pinch off by applying a –5 V on line 35b to its gate through resistor R8 and enabling MESFET switches SW1 and SW2 and MESFET Q1 by placing a 0 V control signal on line 35a at their gates. In the source circuit of the MESFET Q1 is a parallel network comprising R5 and C5 which is a self biasing network for MESFET Q1. The self-biasing network causes a DC voltage to build up across the resistor R5 sufficient to maintain a slight reverse bias of the gate for optimum GaAs MESFET performance.

In this mode, the signal input is directed into an impedance matching network 31 via MESFET switch SW1. The series inductor L1 and capacitor C2, shunt capacitor C3, series inductor L2 and the shunt RLC circuit comprising resistor R2, inductor L3, and capacitor C4 serve as the impedance matching network 31 that matches the source impedance to the input of the device. The design of the impedance matching network for any particular application is well known in the art and includes low pass, high pass and bandpass filters. Design of impedance matching networks are best obtained through the use of synthesis, analysis and optimizing steps.

The high frequency signal is amplified by the MESFET Q1 of power amplifier 26 and coupled to the output matching network comprising shunt inductor L4 and capacitor C7, series capacitor C6 and inductor L5 and shunt capacitor C8. The output impedance matching network is similarly designed by methods well known in the art to achieve a match between the output impedance of the MESFET amplifier Q1 and the load impedance.

It is apparent from the foregoing that the present invention satisfies an immediate need to provide a power amplifier such as in FIG. 2A that reduces the power consumption when operating in lower power modes. The present invention allows high efficiency to be maintained at all power levels of operation and thereby optimizes power output while reducing DC power consumption. This high efficiency multiple power level amplifier may be embodied in other specific forms and used with a variety of communication devices without departing from the spirit or essential attributes of the present invention. It will also be understood that the impedance matching network may be a part of each amplifier. It is therefore desired that the present embodiment be considered in all respects as illustrative and not restrictive, reference being made to the appended claims rather than the foregoing description to indicate the scope of the invention.

What is claimed is:

1. A high efficiency multiple power level amplifier circuit for high frequency applications comprising:

a plurality of power amplifier stages connected in a cascade circuit to produce a signal output from a signal input;

a bypass switch for selectively bypassing at least one power amplifier stage in the cascaded circuit in a bypass mode, said bypass switch being operative independently of the signal input; and wherein said at least one power amplifier stage comprises a power amplifier powered by a power source wherein reduced current is drawn by said power amplifier from said power source in the bypass mode.

2. The high efficiency multiple power level amplifier circuit of claim 1 wherein said at least one power amplifier stage comprises a power amplifier powered by a power source wherein substantially no current is drawn by said power amplifier from said power source in the bypass mode.

3. The high efficiency multiple power level amplifier circuit of claim 2 wherein said power amplifier of said at least one power amplifier stage comprises a Field Effect Transistor (FET).

4. A high efficiency dual power level amplifier monolithic microwave integrated circuit, comprising:

a signal input;

a signal output;

a first power amplifier having an input connected to the signal input and an output;

a second power amplifier having an input for receiving the output of the first power amplifier and an output, said second power amplifier being adapted to be powered by a power source and said second power amplifier further having a high power mode for amplifying signals received at its input and a low power mode wherein substantially no current is drawn thereby from the power source; and a bypass switch for connecting the second power amplifier output to the signal output to provide a high power output level at the signal output in the high power mode, and for connecting the first power amplifier output to the signal output to provide a low power output level at the signal output in the low power mode.

5. The high efficiency dual power level amplifier circuit of claim 4 wherein the first and second power amplifiers comprise FET's.

6. A high efficiency multiple power level amplifier circuit for high frequency applications comprising:

a plurality of power amplifier stages connected in a cascade circuit to produce a signal output from a signal input;

a bypass switch for selectively bypassing at least one power amplifier stage in the cascaded circuit in a bypass mode;

an input switch connected to an input of said at least one power amplifier stage for isolating said input in the bypass mode; and an output switch connected to an output of said at least one power amplifier stage for isolating said output in the bypass mode.

7. The high efficiency multiple power level amplifier of claim 6 wherein the input, output and bypass switches are responsive to a first control signal for opening the input and output switches and closing the bypass switch in the bypass mode, and responsive to a second control signal for closing the input and output switches and opening the bypass switch when not in the bypass mode.

8. The high efficiency multiple power level amplifier circuit of claim 7 wherein the input switch, the output switch and the bypass switch each comprise a Field Effect Transistor (FET).

9. The high efficiency multiple power level amplifier circuit of claim 8 wherein the input switch, the output switch and the bypass switch are controlled by a gate bias circuit of the FETs.

10. A high efficiency multiple power level amplifier circuit for high frequency applications comprising:

a plurality of power amplifier stages connected in a cascade circuit to produce a signal output from a signal input, each of said power amplifier stages comprising an input impedance matching network to match the impedance of a source coupled to the input of such power amplifier stage, and an output impedance matching network to match the impedance of a load connected to the output of such power amplifier stage; and a bypass switch for selectively bypassing at least one power amplifier stage in the cascaded circuit in a bypass mode.

11. The high efficiency multiple power level amplifier circuit of claim 10 wherein said power amplifier of said at least one power amplifier stage comprises a Field Effect Transistor (FET) and said power amplifier is placed in the bypass mode by controlling the gate bias of the FET.

12. A high frequency power amplifier stage for selecting levels of power output while minimizing power consumption in a circuit in which it is used, the power amplifier stage comprising:

a signal input and a signal output;

a power amplifier adapted to be powered by at least one power source and comprising an input and an output, said power amplifier further comprising an enable mode for amplifying signals received at its input and a bypass mode wherein substantially no current is drawn therethrough from said at least one power source;

a bypass switch for coupling the signal input to the signal output, to thereby bypass the power amplifier stage in the bypass mode;

an input isolation switch for coupling the signal input to the input of the power amplifier when said power amplifier is in the enable mode; and an output isolation switch for coupling the signal output to the output of the power amplifier when said power amplifier is in the enable mode.

13. The high frequency power amplifier stage of claim 12 further comprising an impedance matching circuit connected between the input switch and the input to the power amplifier and an impedance matching circuit connected between the output of the power amplifier and the output switch.

14. The high efficiency multiple power level amplifier circuit of claim 4 further comprising means operative in the low power mode for substantially inhibiting said current to said second power amplifier from said power source.

15. A high efficiency dual power level amplifier monolithic microwave integrated circuit, comprising:

a signal input;

a signal output;

a first power amplifier having an input connected to the signal input and an output;

a second power amplifier having an input for receiving the output of the first power amplifier and an output, said second power amplifier being adapted to be powered by a power source and said second power amplifier further having a high power mode for amplifying signals received at its input and a low power mode wherein substantially no current is drawn thereby from the power source;

a bypass switch for connecting the second power amplifier output to the signal output to provide a high power output level at the signal output in the high power mode, and for connecting the first power amplifier output to the signal output to provide a low power output level at the signal output in the low power mode; and an impedance matching network for both the first and second power amplifiers, each impedance matching network comprising an input impedance matching network to match the impedance of a source coupled to the input of the corresponding power amplifier; and an output impedance matching network to match the impedance of a load connected to the output of the corresponding power amplifier.

16. A high efficiency dual power level amplifier monolithic microwave integrated circuit, comprising:

a signal input;

a signal output;

a first power amplifier having an input connected to the signal input and an output;

a second power amplifier having an input for receiving the output of the first power amplifier and an output, said second power amplifier being adapted to be powered by a power source and said second power amplifier further having a high power mode for amplifying signals received at its input and a low power mode wherein substantially no current is drawn thereby from the power source;

a bypass switch for connecting the second power amplifier output to the signal output to provide a high power output level at the signal output in the high power mode, and for connecting the first power amplifier output to the signal output to provide a low power output level at the signal output in the low power mode;

an input isolation switch connected between the first amplifier output and the second power amplifier input;

an output isolation switch connected between the second power amplifier output and the signal output; and wherein said bypass switch is connected in parallel across the isolation switches and the second power amplifier.

17. The high efficiency dual power level amplifier of claim 16 wherein the isolation switches and bypass switch have an open and a closed state, and wherein the isolation switches are open and the bypass switch is closed in the low power mode, and the isolation switches are closed and the bypass switch open in the high power mode.

18. The high efficiency dual power level amplifier circuit of claim 16 wherein the isolation switches and the bypass switch comprise FET's.

19. The high efficiency multiple power level amplifier circuit of claim 18 wherein the isolation switches and the bypass switch are controlled by biasing the gate of the FET's.

20. A high efficiency dual power level amplifier monolithic microwave integrated circuit, comprising:

a signal input;

a signal output;

a first FET amplifier having an input connected to the signal input and an output;

a second FET amplifier having an input for receiving the output of the first FET amplifier and an output, said second FET amplifier being adapted to be powered by a power source and said second FET amplifier further having a high power mode for amplifying signals received at its input and a low power mode wherein substantially no current is drawn thereby from the power source, said second FET amplifier being placed in the low power or high power mode by controlling the gate bias of the FET; and a bypass switch for connecting the second FET amplifier output to the signal output to provide a high power output level at the signal output in the high power mode, and for connecting the first FET amplifier output to the signal output to provide a low power output level at the signal output in the low power mode.

* * * * *